(12) United States Patent
Hsu (10) Patent No.: US 6,386,892 B1
(45) Date of Patent: May 14, 2002

(54) TIN PASTE OVERFLOW-PROTECTIVE ELECTRIC CONNECTOR (75) Inventor: Chun-Hsien Hsu, Taipei (TW)

(73) Assignee: Speed Tech Corp., Taoyuan Hsien (TW)

( * ) Notice: Subject to any disclaimer, the term of this patent is extended or adjusted under 35 U.S.C. 154(b) by 0 days.

(21) Appl. No.: 09/989,384

(22) Filed: Nov. 21, 2001

(51) Int. Cl.⁷ .................................................. H05K 1/00
(52) U.S. Cl. ............................................ 439/83; 439/78
(58) Field of Search ............................. 439/83, 78, 82, 439/79, 80, 81

(56) References Cited

U.S. PATENT DOCUMENTS 4,270,829 A * 6/1981 Wilson ........................ 439/83
4,541,034 A * 9/1985 Fanning ...................... 361/405
5,007,844 A * 4/1991 Mason et al. .................. 439/68
5,535,513 A * 7/1996 Frantz ........................ 29/882
6,241,535 B1 * 5/2001 Lemke et al. ................. 439/83
6,325,655 B1 * 12/2001 Noda et al. ................. 439/342

* cited by examiner

Primary Examiner—P. Austin Bradley
Assistant Examiner—Ross Gushi
(74) Attorney, Agent, or Firm—Rabin & Berdo, P.C.

(57) ABSTRACT

A tin paste overflow-protective electric connector is constructed to include an electrically insulative shell and at least one terminal respectively fastened to a respective terminal hole in the electrically insulative shell, each terminal having a mounting end extended out of the respective terminal hole for fastening to a circuit board, a contact end suspended inside the electrically insulative shell for the connection of a matching electric connector, and a tin paste accumulation hole disposed inside the electrically insulative shell adjacent to one end of the corresponding terminal hole and adapted to collect an overflow of tin paste during surface mounting of the electric connector on the circuit board.

3 Claims, 9 Drawing Sheets

TIN PASTE OVERFLOW-PROTECTIVE ELECTRIC CONNECTOR

BACKGROUND OF THE INVENTION

The present invention relates to electric connectors and, more particularly, to a tin paste overflow-protective electric connector, which prevents a short circuit during its installation in a circuit board.

When fastening an electronic device, for example, an electric connector to a circuit board, the terminals of the electronic device are inserted through respective through holes and then fixedly soldered to the respective through holes of the circuit board. Alternatively SMT (surface mounting technology) may be employed to bond the terminals of the electronic device to the tin paste at the respective pads of the circuit board. For mass production, SMT is commonly used to install electronic devices in circuit boards at two sides. During the application of SMT, an electrically conductive medium, for example, tin paste is applied to the circuit board, and then electronic devices are attached to the circuit board, and then the circuit board with the electronic devices are put in a high temperature stove for baking, causing the electrically conductive medium to be melted and bonded to the respective mounting ends of the terminals of the electronic devices. After cooling, the terminals of the electronic devices are fixedly and electrically connected to the tin paste at the respective pads (contacts) of the circuit board. Because the terminals of the electronic devices are to be fastened to the respective pads of the circuit board, the electrically insulative shell of each electronic device has terminal holes through which the respective terminals extend to the outside for mounting. During baking in the high temperature stove, a siphon effect may be produced in the terminal holes, thereby causing the molten electrically conductive medium (the tin paste) to be sucked into the inside of the electrically insulative shell and covered over the contact end of each terminal. When an overflow of electrically conductive medium (the tin paste) occurs, the terminals may be short-circuited, or the structural strength of the terminals may be weakened. Further, in order to minimize installation space, electronic devices and/or connectors may be installed in both the top and bottom sides of a circuit board. In this case, the electronic devices and/or connectors at the front side of the circuit board will be heated twice in the high temperature stove.

Figure 7:
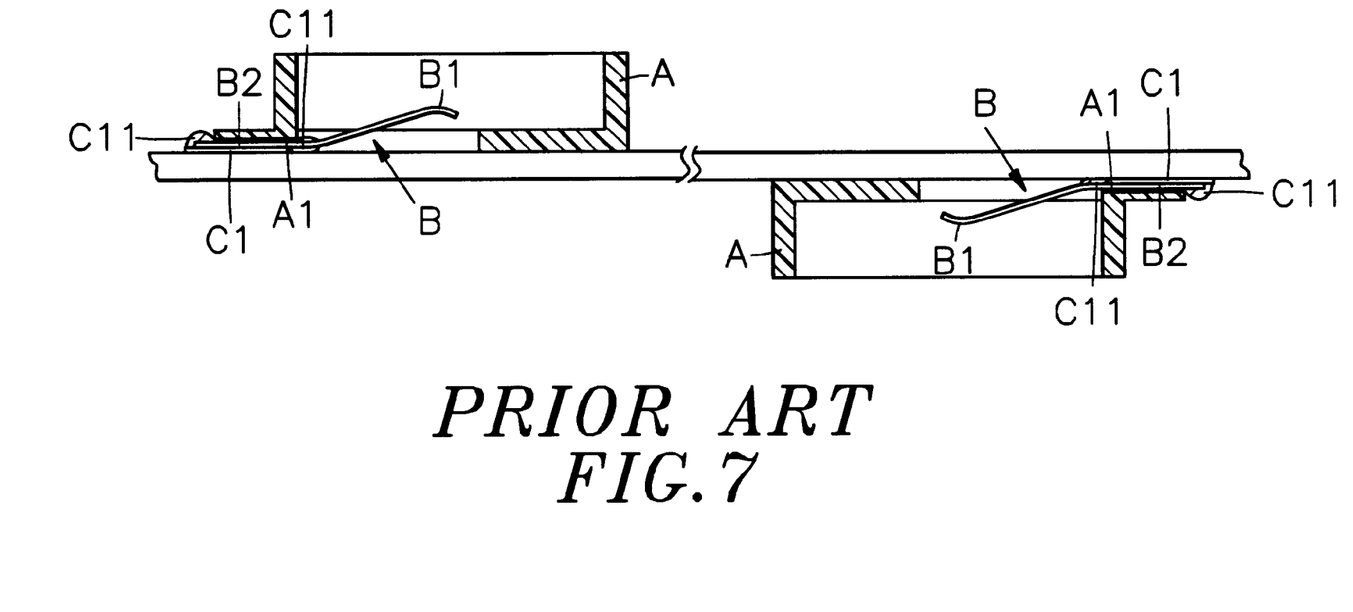
FIG. 7 is a sectional view showing electric connectors fastened to the top and bottom sides of a circuit board according to the prior art.

FIG. 7 shows electronic connectors installed in top and bottom sides of a circuit board C. As illustrated, each electric connector comprises an electrically insulative shell A, and a plurality of terminals B respectively fastened to respective terminal holes A1 in the electrically insulative shell A. Each terminal B has a contact end B1 suspended inside the electrically insulative shell A, and a mounting end B2 disposed outside the electrically insulative shell A for bonding to the tin paste C11 at the corresponding pad (contact) C1 of the circuit board C by SMT (surface mounting technology). During bonding of electronic connectors to the tin paste C11 at the pads C1 at the bottom side of the circuit board C after installation of respective electronic connectors in the top side of the circuit board C, the tin paste C11 at the mounting ends B2 of the terminals B of the electronic connectors at the top side of the circuit board C is melted again. At this time, the molten tin paste tends to be drawn into the inside of the electrically insulative shell A through the respective terminal holes A1, and covered over the contact ends B1 of the terminals B of the electronic connectors at the top side of the circuit board C, causing a short circuit.

Figure 8:
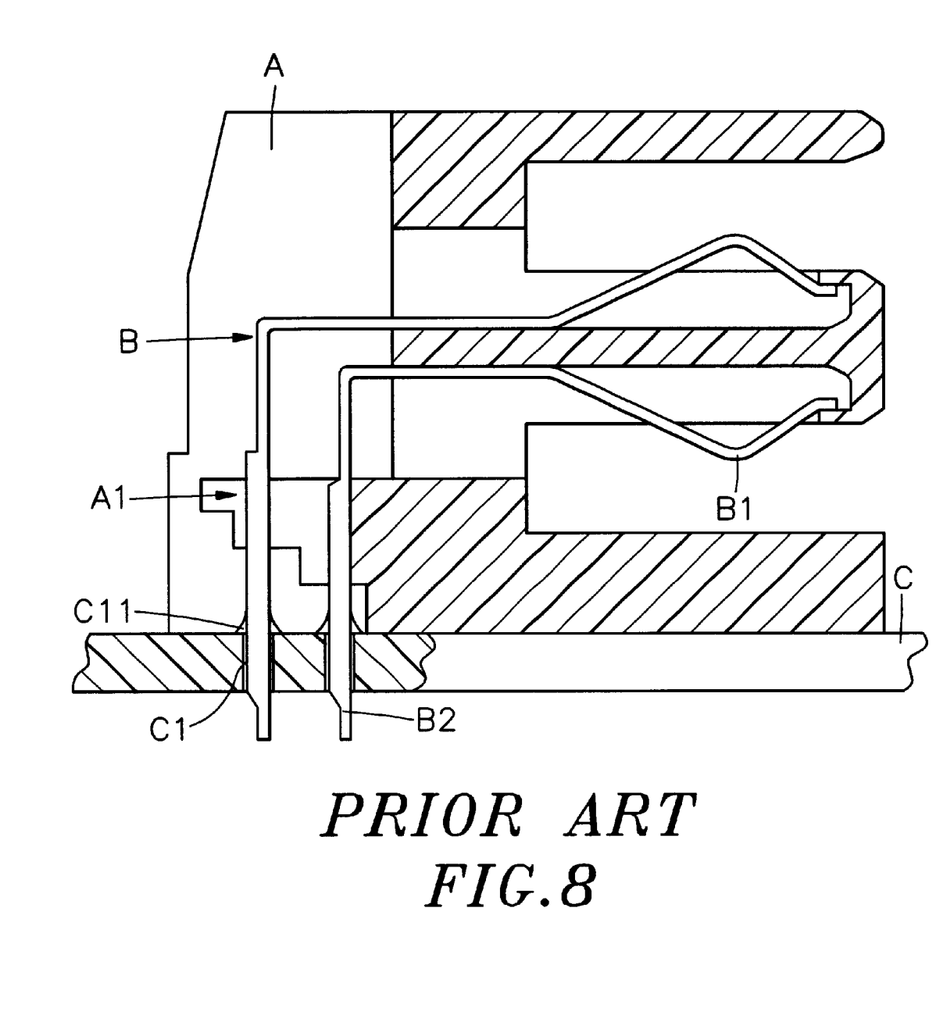
FIG. 8 is a sectional view showing the terminals of an electric connector fastened to respective through holes in a circuit board according to the prior art.

FIG. 8 shows an electric connector fastened to respective through holes in a circuit board according to the prior art. As illustrated, the mounting ends B2 of the terminals B are extended out of respective terminal holes A1 of the electrically insulative shell A and inserted through respective tubular contacts C1 in the circuit board C, and then bonded to the tin paste C11 in the tubular contacts C1. Because the electronic connector has a small height (some electric connectors are shorter than 0.9 mm), there is limited spacing space between the terminal holes A1 and the tubular contacts C1 in the circuit board C. During baking, the molten tin paste may flow over the mounting ends B2 of the terminals B, causing a short circuit.

SUMMARY OF THE INVENTION

The present invention has been accomplished to provide an electric connector, which eliminates the aforesaid problems. It is the main object of the present invention to provide a tin paste overflow-protective electric connector, which protects against an overflow of tin paste during its mounting on a circuit board. It is another object of the present invention to provide a tin paste overflow-protective electric connector, which is suitable for fastening to a circuit board by SMT (surface mounting technology). To achieve these and other objects of the present invention, the tin pate overflow-protective electric connector comprises an electrically insulative shell and at least one terminal respectively fastened to a respective terminal hole in the electrically insulative shell. Each terminal has a mounting end extended out of the respective terminal hole for fastening to a circuit board, a contact end suspended inside the electrically insulative shell for the connection of a matching electric connector, and a tin paste accumulation hole disposed inside the electrically insulative shell adjacent to one end of the corresponding terminal hole and adapted to collect an overflow of tin paste during surface mounting of the electric connector on the circuit board. During the application of SMT, the overflow of tin paste is accumulated in the tin paste accumulation hole of each terminal, and stopped from flowing to the contact end of each terminal.

DETAILED DESCRIPTION OF THE PREFERRED EMBODIMENT

Referring to FIGS. 1, 1A, 2, 3, and 4, SMT (surface mounting technology) is employed to fasten an electric connector to a circuit board 3. The electric connector comprises an electrically insulative shell 1 and at least one terminal 2. The electrically insulative shell 1 has at least one terminal hole 11 for the mounting of the at least one terminal 2. The at least one terminal 2 is respectively inserted through and fixedly fastened to the at least one terminal hole 11, each having a rear mounting end 22 and a front contact end 21 respectively disposed outside the at least one terminal hole 11. The rear mounting end 22 is adapted for fastening to the tin paste C11 at one pad C1 of the circuit board 3. The front contact end 21 is adapted for contacting the corresponding terminal of the matched electric connector (not shown). Further, each terminal 2 has a tin paste accumulation hole 23 spaced between the respective front contact end 21 and the rear mounting end 22. After installation of one terminal 2 in one terminal hole 11 of the electrically insulative shell 1, the tin paste accumulation hole 23 is disposed adjacent to one end of the corresponding terminal hole 11 inside the electrically insulative shell 1. During installation of the electric connector in the circuit board 3, the tin paste C11 at each pad C1 of the circuit board 3 is melted and bonded to the rear mounting end 22 of each terminal 2 of the electric connector respectively, and then quickly cooled down. In case a siphon effect is produced in each terminal hole 11 of the electrically insulative shell 1 to suck in molten tin paste during installation of the electric connector in the circuit board 3, the tin paste accumulation hole 23 of each terminal 2 collects the overflow of tin paste C11, preventing the overflow of tin paste C11 from passing to the contact end 21.

Figure 1:
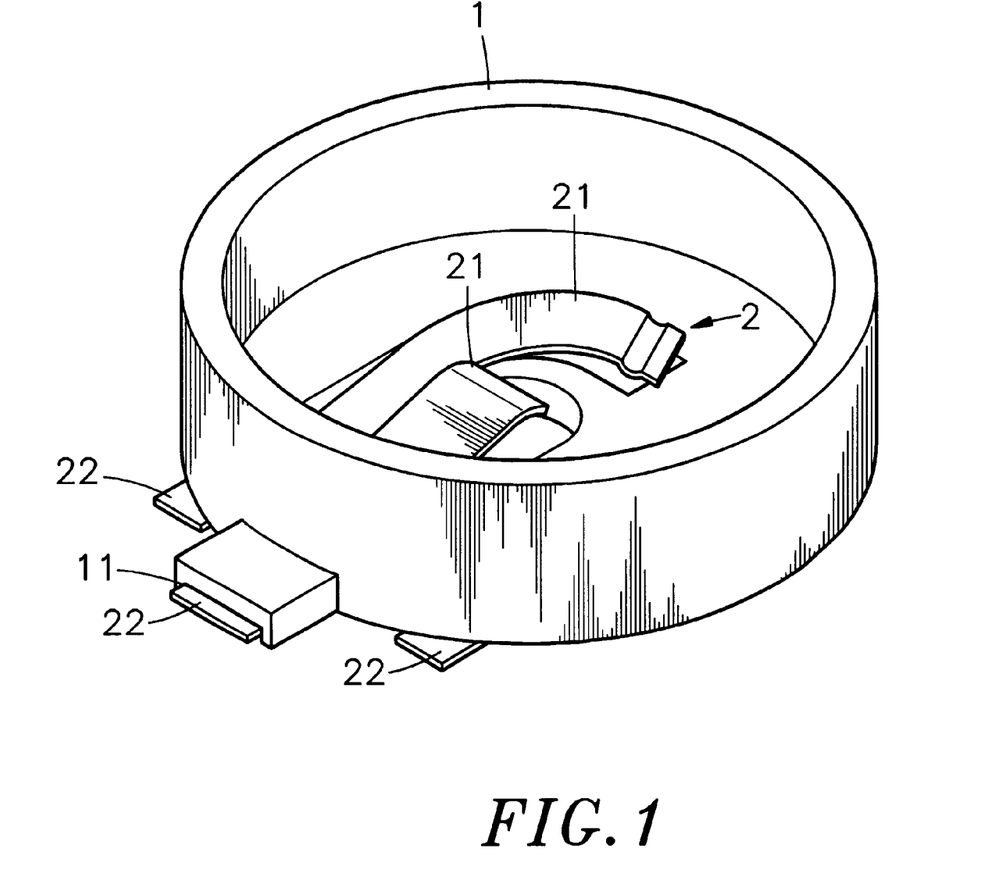
FIG. 1 is an elevational view of a tin paste overflow-protective electric connector constructed according to the present invention.
Figure 1A:
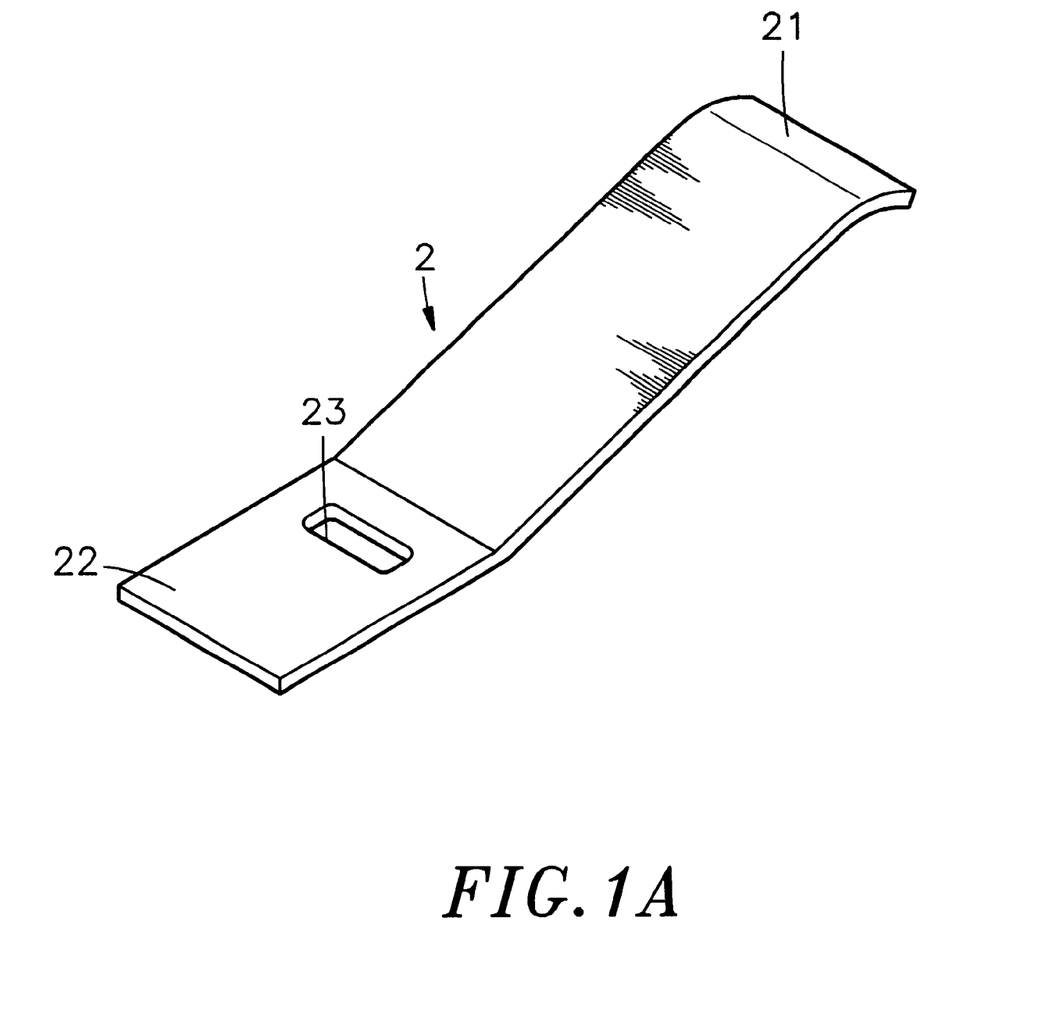
FIG. 1A is an elevational view of a terminal for the tin paste overflow-protective electric connector according to the present invention.
Figure 2:
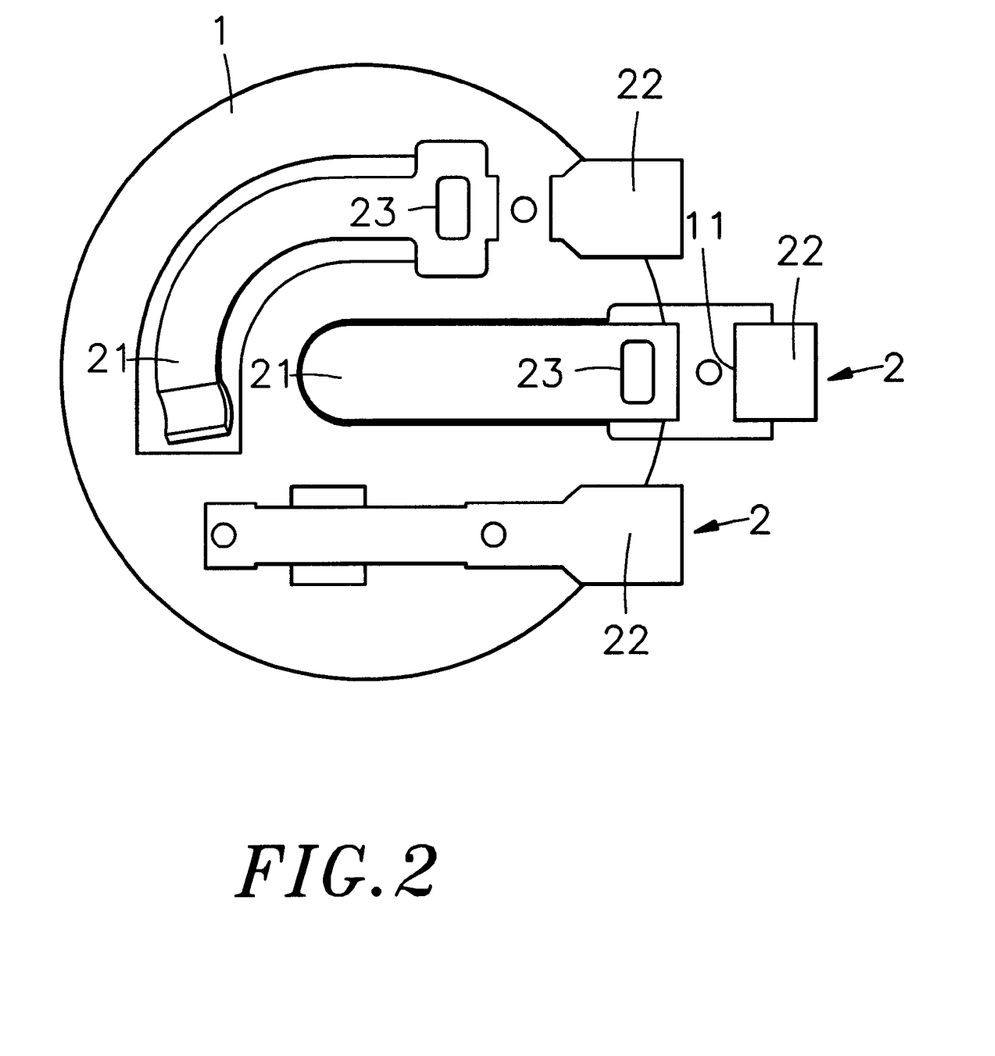
FIG. 2 is a top view of the tin paste overflow-protective electric connector according to the present invention.
Figure 3:
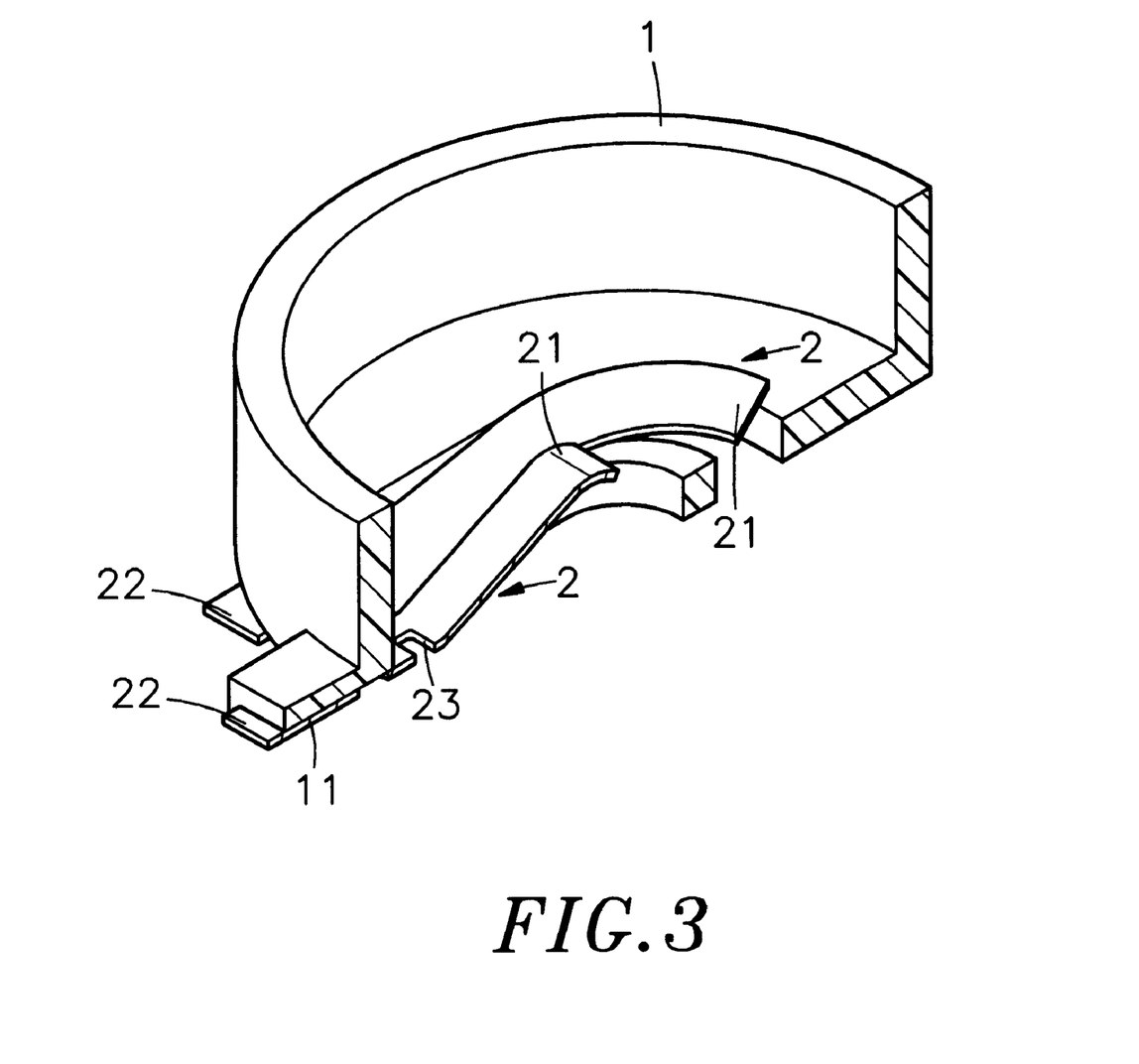
FIG. 3 is a sectional elevation of a part of the tin paste overflow-protective electric connector according to the present invention.
Figure 4:
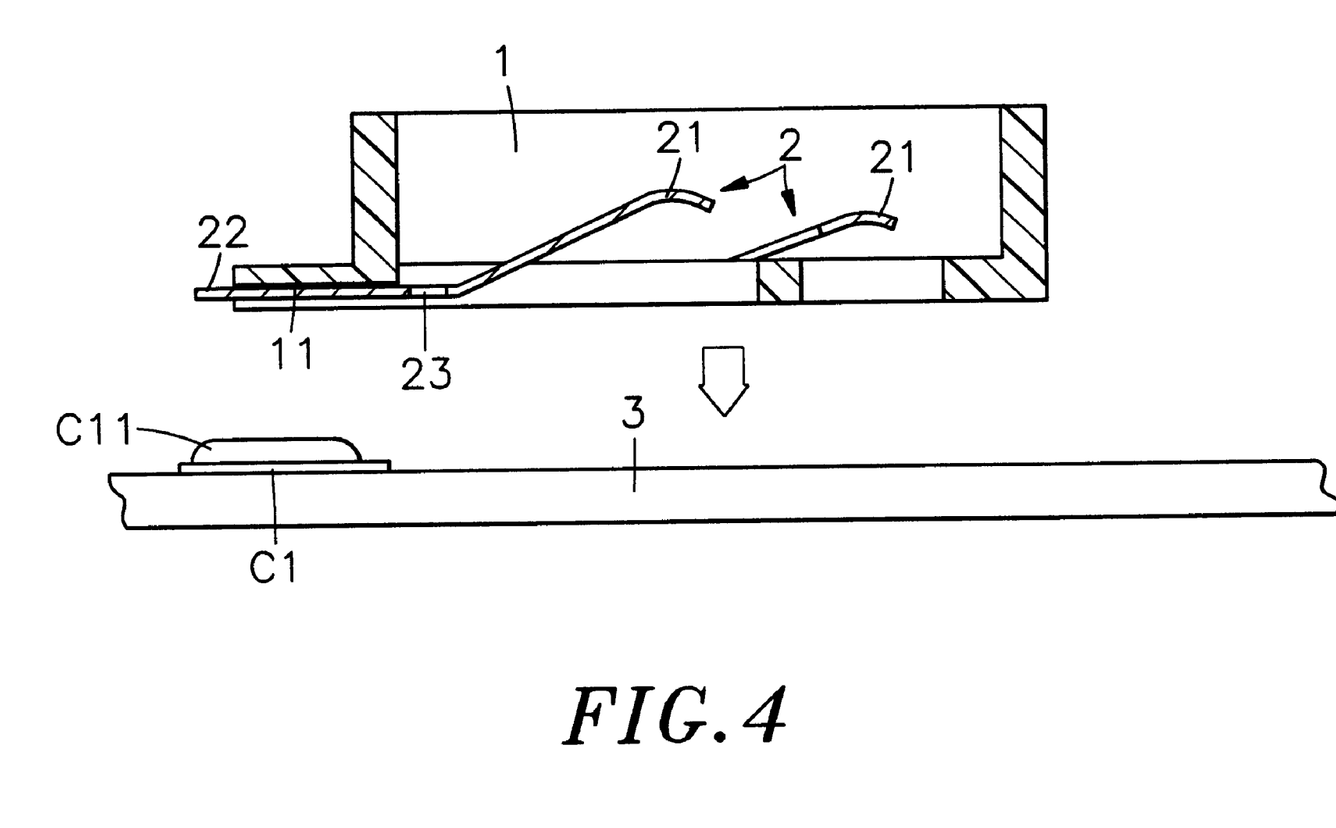
FIG. 4 is a sectional view showing a SMT mounting example of the present invention before connection of the tin paste overflow-protective electric connector to the circuit board.
Figure 5:
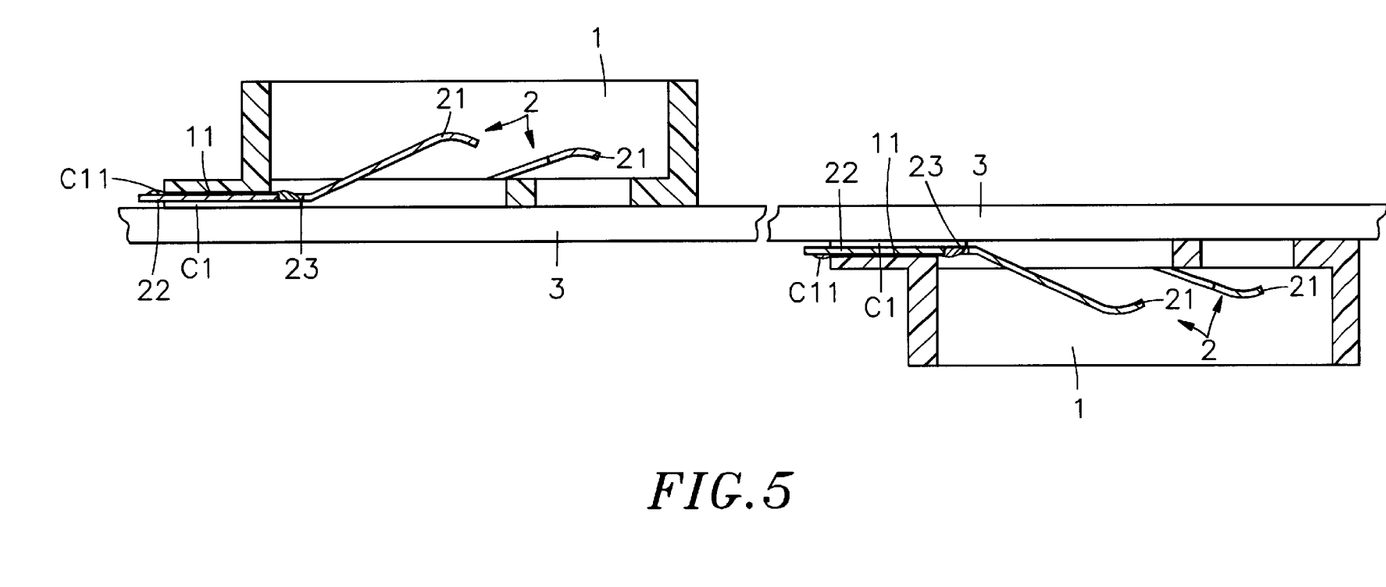
FIG. 5 is a sectional view showing a SMT mounting example of the present invention after connection of the tin paste overflow-protective electric connector to the circuit board.

Referring to FIG. 5, when the circuit board 3 turned upside down to receive a secondary high temperature stove baking treatment; the tin paste C11 at the pads C1 at the front side of the circuit board 3 will be melted again. At this time, the overflow of tin paste C11 will be accumulated in the tin paste accumulation hole 23 of each terminal 2 of the electric connector mounted on the front side of the circuit board 3, preventing the overflow of tin paste C11 from flowing to the contact end 21 of each terminal 2.

Figure 6:
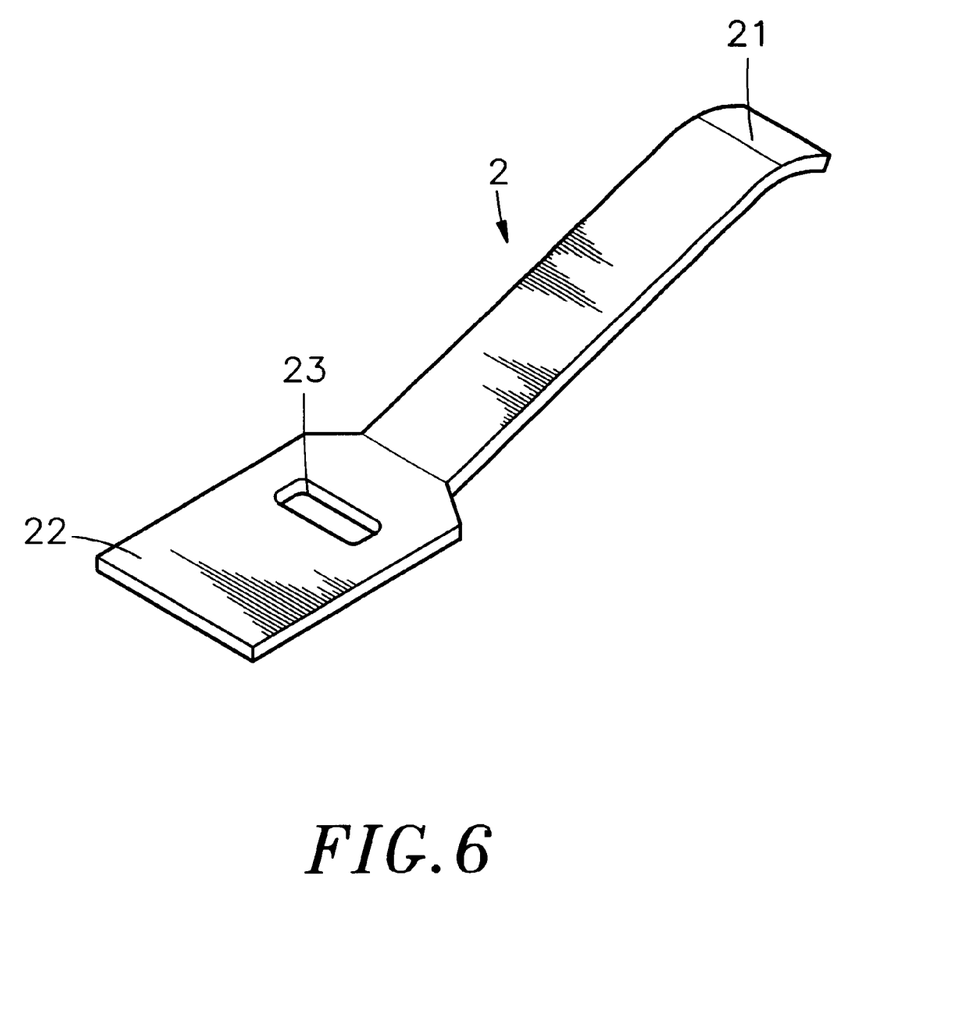
FIG. 6 is an elevational view of an alternate form of the terminal for the tin paste overflow-protective electric connector according to the present invention.

FIG. 6 shows an alternate form of the terminal 2. According to this alternate form, the tin paste accumulation hole 23 is a transversely extended oblong hole having a width approximately equal to the width of the contact end 21.

A prototype of tin paste overflow-protective electric connector has been constructed with the features of the annexed drawings of FIGS. 1~6. The tin paste overflow-protective electric connector functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A tin paste overflow-protective electric connector comprising an electrically insulative shell, said electrically insulative shell comprising at least one terminal hole, said at least one terminal hole each having an inner end and an outer end, and at least one terminal respectively fastened to said electrically insulative shell, said at least one terminal each having a mounting end extended out of the outer end of the corresponding terminal hole and disposed outside said electrically insulative shell and adapted for fastening to a circuit board and a contact end extended out of the inner end of the corresponding terminal hole and suspended inside said electrically insulative shell, wherein said at least one terminal each has a tin paste accumulation hole spaced between the mounting end and contact end thereof and disposed inside said electrically insulative shell adjacent to the inner end of the corresponding terminal hole.

2. The tin paste overflow-protective electric connector as claimed in claim 1, wherein the mounting end of each of said at least one terminal is adapted for fastening to a circuit board by SMT (surface mounting technology).

3. The tin paste overflow-protective electric connector as claimed in claim 1, wherein the tin paste accumulation hole of each of said at least one terminal has a width approximately equal to the width of the front contact end of each of said at least one terminal.

* * * * *